United States Patent
Mahanfar et al.

(10) Patent No.: US 11,699,852 B2
(45) Date of Patent: Jul. 11, 2023

(54) PHASED ARRAY ANTENNA SYSTEMS

(71) Applicant: Space Exploration Technologies Corp., Hawthorne, CA (US)

(72) Inventors: Alireza Mahanfar, Redmond, WA (US); Javier Rodriguez De Luis, Redmond, WA (US)

(73) Assignee: Space Exploration Technologies Corp., Hawthorne, CA (US)

( * ) Notice: Subject to any disclaimer, the term of this patent is extended or adjusted under 35 U.S.C. 154(b) by 985 days.

(21) Appl. No.: 16/276,257

(22) Filed: Feb. 14, 2019

(65) Prior Publication Data

US 2019/0252775 A1   Aug. 15, 2019

Related U.S. Application Data

(60) Provisional application No. 62/631,195, filed on Feb. 15, 2018.

(51) Int. Cl.
| | |
|---|---|
| *H01Q 3/36* | (2006.01) |
| *H01Q 1/22* | (2006.01) |
| *H05K 1/02* | (2006.01) |
| *H05K 1/14* | (2006.01) |

(52) U.S. Cl.
CPC ............. *H01Q 3/36* (2013.01); *H01Q 1/22* (2013.01); *H05K 1/0298* (2013.01); *H05K 1/144* (2013.01)

(58) Field of Classification Search
CPC ........ H05K 1/144; H05K 1/0298; H01Q 1/22; H01Q 3/36
USPC ........................................................ 342/368
See application file for complete search history.

(56) References Cited

U.S. PATENT DOCUMENTS

| | | |
|---|---|---|
| 5,122,806 A | 6/1992 | Julian |
| 7,466,287 B1 | 12/2008 | Lam et al. |
| 7,626,556 B1 | 12/2009 | Pluymers et al. |
| 9,379,437 B1 | 6/2016 | Stutzke et al. |
| 10,141,993 B2 | 11/2018 | Lee et al. |
| 10,333,633 B2 | 6/2019 | Petersson et al. |
| 10,553,940 B1 | 2/2020 | Bongard |
| 2001/0018327 A1 | 8/2001 | Houston et al. |

(Continued)

FOREIGN PATENT DOCUMENTS

| | | |
|---|---|---|
| KR | 1020110027494 A | 3/2011 |
| KR | 101454878 A | 11/2014 |

OTHER PUBLICATIONS

International Search Report and Written Opinion dated Jun. 7, 2019, issued in corresponding International Application No. PCT/US2019/018064, filed Feb. 14, 2019, 11 pages.

(Continued)

*Primary Examiner* — Tremesha S Willis
(74) *Attorney, Agent, or Firm* — Polsinelli PC (57) ABSTRACT

In one embodiment of the present disclosure, a phased array antenna system includes a first portion carrying an antenna lattice including a plurality of antenna elements, wherein the plurality of antenna elements are arranged in a first configuration, and a second portion carrying a beamformer lattice including a plurality of beamformer elements, wherein the plurality of beamformer elements are arranged in a second configuration different from the first configuration, wherein each of the plurality of antenna elements are electrically coupled to one of the plurality of beamformer elements.

23 Claims, 10 Drawing Sheets

(56) References Cited

U.S. PATENT DOCUMENTS

| | | |
|---|---|---|
| 2003/0076274 A1 | 4/2003 | Phelan et al. |
| 2003/0151550 A1 | 8/2003 | Chen et al. |
| 2007/0063898 A1 | 3/2007 | Phelan et al. |
| 2007/0152886 A1 | 7/2007 | Baliarda et al. |
| 2008/0150832 A1 | 6/2008 | Ingram et al. |
| 2008/0291101 A1 | 11/2008 | Braunstein et al. |
| 2008/0297414 A1 | 12/2008 | Krishnaswamy et al. |
| 2009/0009392 A1 | 1/2009 | Jacomb-Hood et al. |
| 2013/0127682 A1 | 5/2013 | MacManus et al. |
| 2013/0194134 A1* | 8/2013 | Beeker ............ H01Q 3/2682 342/375 |
| 2013/0194152 A1 | 8/2013 | Puente Baliarda et al. |
| 2014/0266897 A1 | 9/2014 | Jakoby et al. |
| 2015/0015453 A1 | 1/2015 | Puzella et al. |
| 2016/0172755 A1 | 6/2016 | Chen et al. |
| 2016/0204508 A1 | 7/2016 | Christopher |
| 2017/0163326 A1 | 6/2017 | Kitae et al. |
| 2017/0271776 A1 | 9/2017 | Biancotto et al. |

OTHER PUBLICATIONS

International Search Report and Written Opinion dated Jun. 5, 2019, issued in corresponding International Application No. PCT/US2019/018071, filed Feb. 14, 2019, 16 pages.

International Search Report and Written Opinion dated Aug. 22, 2019, issued in corresponding International Application No. PCT/US2019/018096, filed Feb. 14, 2019, 17 pages.

International Search Report and Written Opinion dated Apr. 10, 2020, issued in corresponding International Application No. PCT/US2019/018092, filed Feb. 14, 2019, 15 pages.

International Search Report and Written Opinion dated Jun. 7, 2019, issued in corresponding International Application No. PCT/US2019/018077, filed Feb. 14, 2019, 10 pages.

* cited by examiner

PHASED ARRAY ANTENNA SYSTEMS

CROSS-REFERENCE TO RELATED APPLICATION

This application claims the benefit of U.S. Provisional Application No. 62/631,195, filed Feb. 15, 2018, the disclosure of which is hereby incorporated by reference herein in its entirety.

BACKGROUND

An antenna (such as a dipole antenna) typically generates radiation in a pattern that has a preferred direction. For example, the generated radiation pattern is stronger in some directions and weaker in other directions. Likewise, when receiving electromagnetic signals, the antenna has the same preferred direction. Signal quality (e.g., signal to noise ratio or SNR), whether in transmitting or receiving scenarios, can be improved by aligning the preferred direction of the antenna with a direction of the target or source of the signal. However, it is often impractical to physically reorient the antenna with respect to the target or source of the signal. Additionally, the exact location of the source/target may not be known. To overcome some of the above shortcomings of the antenna, a phased array antenna can be formed from a set of antenna elements to simulate a large directional antenna. An advantage of a phased array antenna is its ability to transmit and/or receive signals in a preferred direction (e.g., the antenna's beamforming ability) without physical repositioning or reorientating.

It would be advantageous to configure phased array antennas having increased bandwidth while maintaining a high ratio of the main lobe power to the side lobe power. Likewise, it would be advantageous to configure phased array antennas having reduced weight, reduced size, lower manufacturing cost, and/or lower power requirements. Accordingly, embodiments of the present disclosure are directed to these and other improvements in phase array antennas or portions thereof.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with one embodiment of the present disclosure, a phased array antenna system is provided. The system includes a first portion carrying an antenna lattice including a plurality of antenna elements, wherein the plurality of antenna elements are arranged in a first configuration, and a second portion carrying a beamformer lattice including a plurality of beamformer elements, wherein the plurality of beamformer elements are arranged in a second configuration different from the first configuration, wherein each of the plurality of antenna elements are electrically coupled to one of the plurality of beamformer elements.

In any of the embodiments described herein, at least one of the plurality of antenna elements may be laterally spaced from a corresponding one of the plurality of beamformer elements.

In any of the embodiments described herein, the first configuration may be a space tapered configuration.

In any of the embodiments described herein, the second configuration may be an organized or evenly spaced configuration.

In any of the embodiments described herein, the first and second portions may define at least a portion of a carrier.

In any of the embodiments described herein, the carrier may have a first side facing in a first direction and a second side facing in a second direction away from the first direction.

In any of the embodiments described herein, the antenna lattice may be on the first side of the carrier.

In any of the embodiments described herein, the beamformer lattice may be on the second side of the carrier.

In any of the embodiments described herein, the antenna elements and the beamformer elements may be in a 1:1 ratio.

In any of the embodiments described herein, the antenna elements and the beamformer elements may be in a greater than 1:1 ratio.

In any of the embodiments described herein, the first and second portions may be first and second layers.

In any of the embodiments described herein, the system may further include a third layer disposed between the first portion and the second portion carrying at least a portion of a mapping including a first plurality of mapping traces on a first surface on the third portion, wherein at least some of the first plurality of mapping traces provide at least a portion of the electrical connection between the plurality of antenna elements and the plurality of beamformer elements.

In any of the embodiments described herein, the first, second, and third layers may be discrete PCB layers in a PCB stack.

In any of the embodiments described herein, at least one of the first, second, and third layers may include a plurality of sub-layers forming the layer.

In any of the embodiments described herein, the system may further include a first plurality of vias through the first, second, and/or third layers, each via of the first plurality of vias connecting one of the plurality of antenna elements or one of the plurality of beamformer elements to one of a first plurality of mapping traces.

In any of the embodiments described herein, the first plurality of mapping traces may be equidistant in length for RF signal propagation.

In any of the embodiments described herein, the first plurality of mapping traces may not cross each other on the first surface.

In any of the embodiments described herein, wherein the third layer may include a plurality of sub-layers disposed between the first layer and the second layer, wherein at least two sub-layers carrying at least a portion of the mapping including the first plurality of mapping traces on the first surface in a first sub-layer and the second plurality of mapping traces on a second surface in the second sub-layer, wherein at least some of the first and second plurality of mapping traces provide at least a portion of the electrical connection between the plurality of antenna elements and the plurality of beamformer elements.

In any of the embodiments described herein, the system may further include a second plurality of vias through at least one of the first, second, and third layers, each via of the second plurality of vias connecting one of the first plurality of mapping traces to one of the second plurality of mapping traces.

In any of the embodiments described herein, the system may further include a second plurality of vias through the first, second, and third layers, each via of the second plurality of vias connecting one of the plurality of antenna elements or one of the plurality of beamformer elements to one of the second plurality of mapping traces.

In any of the embodiments described herein, the first and second pluralities of mapping traces in the same plane may not cross each other.

In any of the embodiments described herein, the first plurality of mapping traces in the first layer and the second plurality of mapping traces in the second layer may cross a line extending normal to the first and second layers.

In any of the embodiments described herein, the second plurality of mapping traces may be equidistant in length for RF signal propagation.

In any of the embodiments described herein, the antenna lattice may include a first plurality of antenna elements configured for operating at a first value of a parameter and second plurality of antenna elements configured for operating at a second value of a parameter.

In any of the embodiments described herein, a third layer may include at least first and second sub-layers disposed between the first layer and the second layer, wherein a first plurality of mapping traces in at least a first sublayer is electrically coupled to the first plurality of antenna elements, and wherein a second plurality of mapping traces in at least a second sublayer is electrically coupled to the second plurality of antenna elements.

In any of the embodiments described herein, the system may further include a first plurality of vias through the first, second, and/or third layers, each via of the first plurality of vias connecting one of the plurality of antenna elements or one of the plurality of beamformer elements to one of the first plurality of mapping traces.

In any of the embodiments described herein, the first plurality of mapping traces in at least first and third sub-layers may be electrically coupled to the first plurality of antenna elements, and wherein the second plurality of mapping traces in at least second and fourth sub-layers are electrically coupled to the second plurality of antenna elements.

In any of the embodiments described herein, the system may further include a second plurality of vias through the third layer, each via of the second plurality of vias electrically coupling at least some of the first plurality of mapping traces with at least some of a third plurality of mapping traces or at least some of the second plurality of mapping traces with at least some of a fourth plurality of mapping traces.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein.

DETAILED DESCRIPTION

Embodiments of the present disclosure are directed to apparatuses and methods relating to phased array antenna systems. In one embodiment, a phased array antenna system includes a first portion carrying an antenna lattice including a plurality of antenna elements, wherein the plurality of antenna elements are arranged in a first configuration, and a second portion carrying a beamformer lattice including a plurality of beamformer elements, wherein the plurality of beamformer elements are arranged in a second configuration different from the first configuration, wherein each of the plurality of antenna elements are electrically coupled to one of the plurality of beamformer elements. These and other aspects of the present disclosure will be more fully described below.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. Additionally, it should be appreciated that items included in a list in the form of "at least one A, B, and C" can mean (A); (B); (C); (A and B); (B and C); (A and C); or (A, B, and C). Similarly, items listed in the form of "at least one of A, B, or C" can mean (A); (B); (C); (A and B); (B and C); (A and C); or (A, B, and C).

Language such as "top surface", "bottom surface", "vertical", "horizontal", and "lateral" in the present disclosure is meant to provide orientation for the reader with reference to the drawings and is not intended to be the required orientation of the components or to impart orientation limitations into the claims.

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, it may not be included or may be combined with other features.

Many embodiments of the technology described herein may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, controller or data processor that is specifically programmed, configured or constructed to perform one or more of the computer-executable instructions described above. Accordingly, the terms "computer" and "controller" as generally used herein refer to any data processor and can include Internet appliances and hand-held devices (including palm-top computers, wearable computers, cellular or mobile phones, multi-processor systems, processor-based or programmable consumer electronics, network computers, mini computers and the like). Information handled by these computers can be presented at any suitable display medium, including a CRT display or LCD.

Figure 1A:
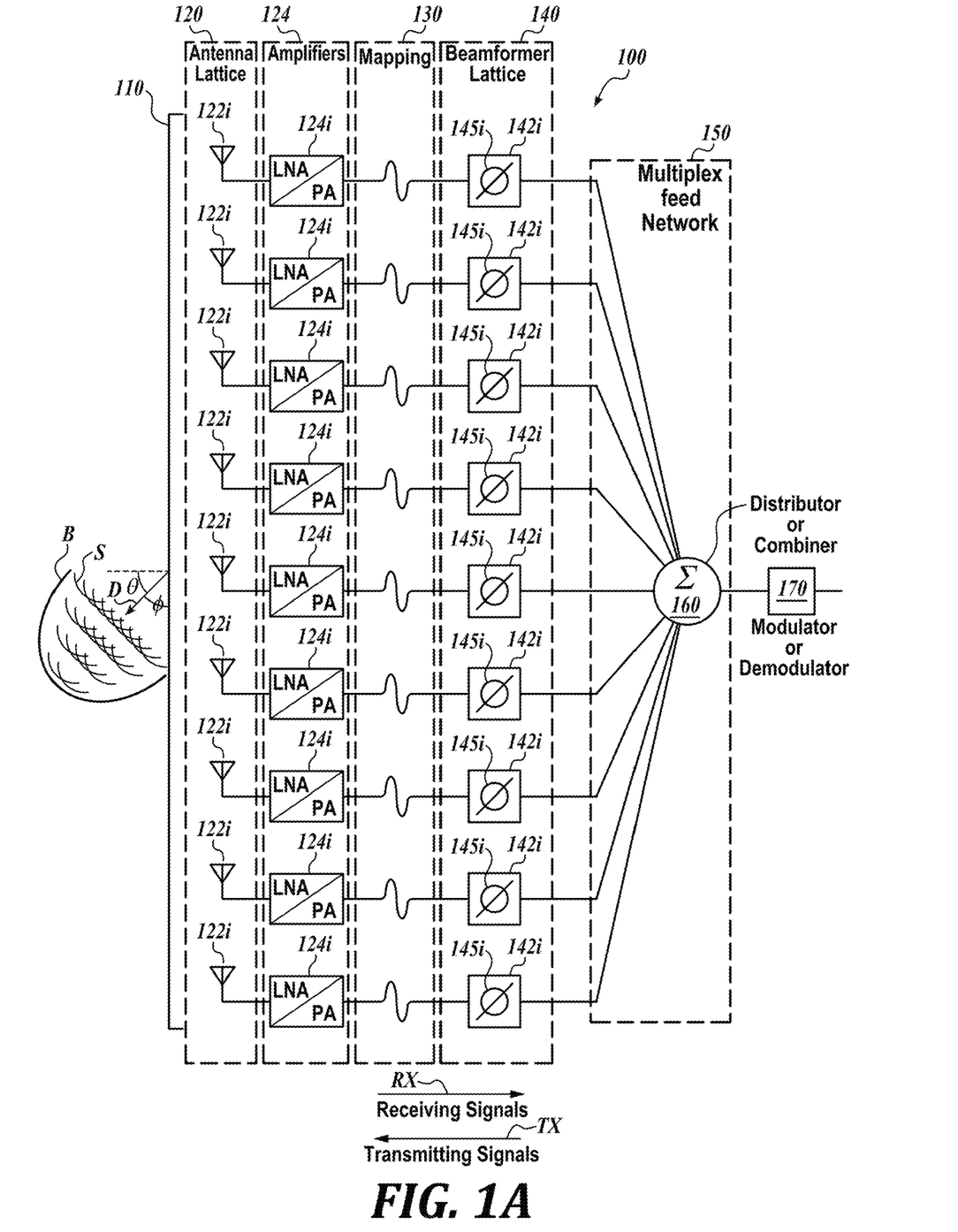
FIG. 1A illustrates a schematic of an electrical configuration for a phased array antenna system in accordance with one embodiment of the present disclosure including an antenna lattice defining an antenna aperture, mapping, a beamformer lattice, a multiplex feed network, a distributor or combiner, and a modulator or demodulator.

FIG. 1A is a schematic illustration of a phased array antenna system 100 in accordance with embodiments of the present disclosure. The phased array antenna system 100 is designed and configured to transmit or receive a combined beam B composed of signals S (also referred to as electromagnetic signals, wavefronts, or the like) in a preferred direction D from or to an antenna aperture 110. (Also see the combined beam B and antenna aperture 110 in FIG. 1B). The direction D of the beam B may be normal to the antenna aperture 110 or at an angle θ from normal.

Referring to FIG. 1A, the illustrated phased array antenna system 100 includes an antenna lattice 120, a mapping system 130, a beamformer lattice 140, a multiplex feed network 150 (or a hierarchical network or an H-network), a combiner or distributor 160 (a combiner for receiving signals or a distributor for transmitting signals), and a modulator or demodulator 170. The antenna lattice 120 is configured to transmit or receive a combined beam B of radio frequency signals S having a radiation pattern from or to the antenna aperture 110.

In accordance with embodiments of the present disclosure, the phased array antenna system 100 may be a multi-beam phased array antenna system, in which each beam of the multiple beams may be configured to be at different angles, different frequency, and/or different polarization.

In the illustrated embodiment, the antenna lattice 120 includes a plurality of antenna elements 122$i$. A corresponding plurality of amplifiers 124$i$ are coupled to the plurality of antenna elements 122$i$. The amplifiers 124$i$ may be low noise amplifiers (LNAs) in the receiving direction RX or power amplifiers (PAs) in the transmitting direction TX. The plurality of amplifiers 124$i$ may be combined with the plurality of antenna elements 122$i$ in for example, an antenna module or antenna package. In some embodiments, the plurality of amplifiers 124$i$ may be located in another lattice separate from the antenna lattice 120.

Figure 1B:
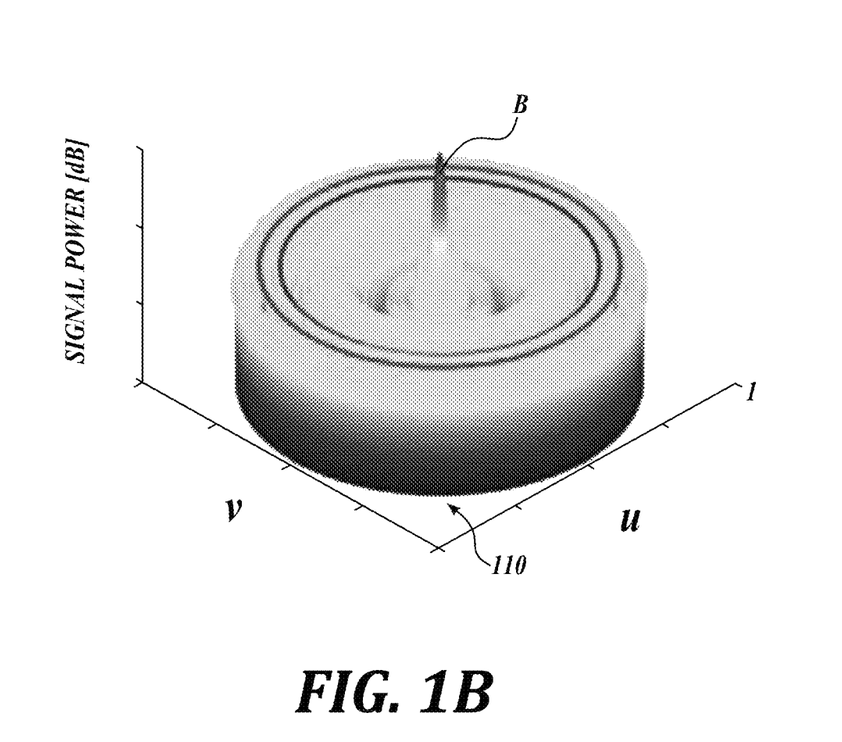
FIG. 1B illustrates a signal radiation pattern achieved by a phased array antenna aperture in accordance with one embodiment of the present disclosure.

Multiple antenna elements 122$i$ in the antenna lattice 120 are configured for transmitting signals (see the direction of arrow TX in FIG. 1A for transmitting signals) or for receiving signals (see the direction of arrow RX in FIG. 1A for receiving signals). Referring to FIG. 1B, the antenna aperture 110 of the phased array antenna system 100 is the area through which the power is radiated or received. In accordance with one embodiment of the present disclosure, an exemplary phased array antenna radiation pattern from a phased array antenna system 100 in the u/v plane is provided in FIG. 1B. The antenna aperture has desired pointing angle D and an optimized beam B, for example, reduced side lobes Ls to optimize the power budget available to the main lobe Lm or to meet regulatory criteria for interference, as per regulations issued from organizations such as the Federal Communications Commission (FCC) or the International Telecommunication Union (ITU). (See FIG. 1F for a description of side lobes Ls and the main lobe Lm.)

Figure 1C:
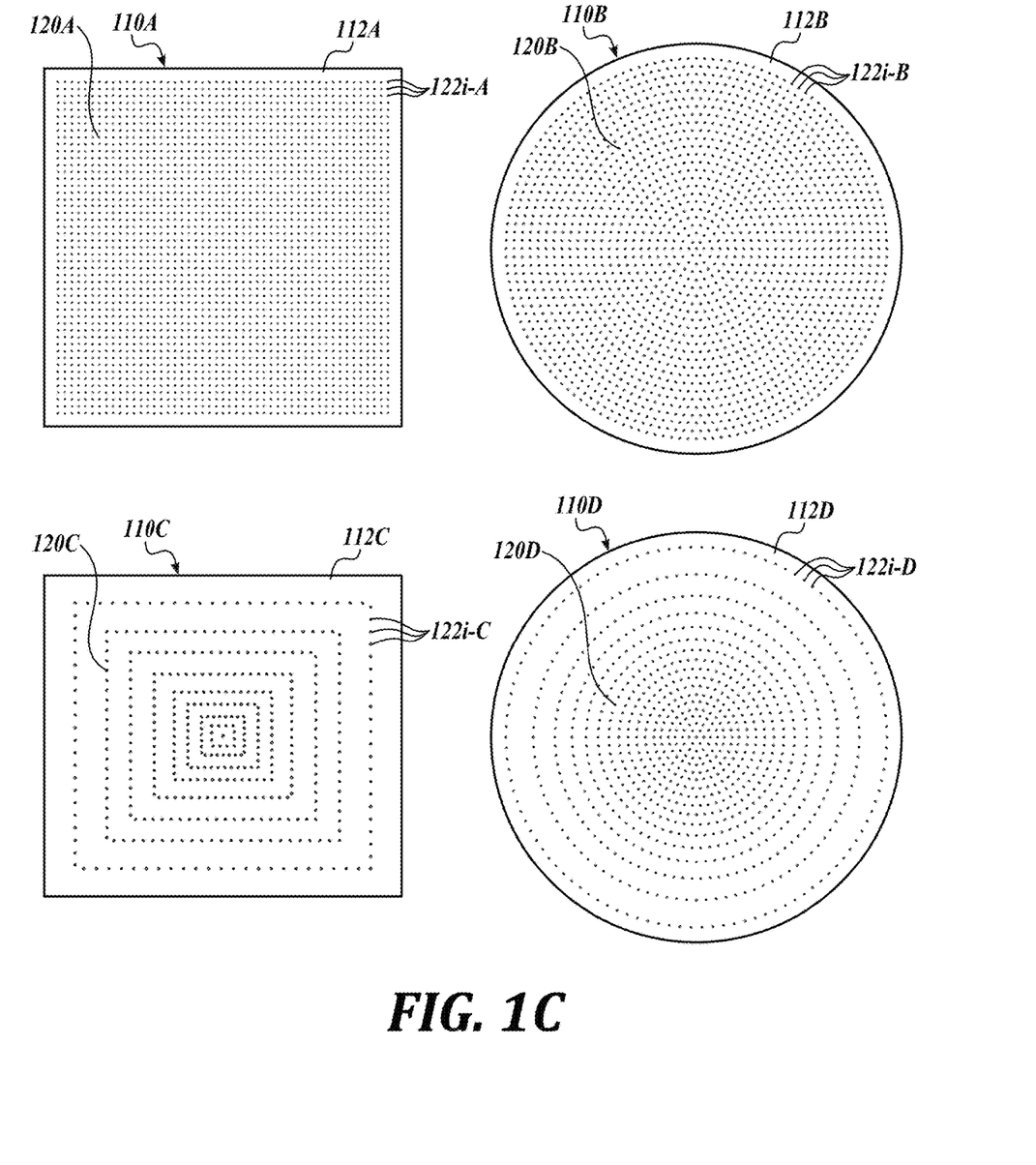
FIG. 1C illustrates schematic layouts of individual antenna elements of phased array antennas to define various antenna apertures in accordance with embodiments of the present disclosure (e.g., rectangular, circular, space tapered).

Referring to FIG. 1C, in some embodiments (see embodiments 120A, 120B, 120C, 120D), the antenna lattice 120 defining the antenna aperture 110 may include the plurality of antenna elements 122$i$ arranged in a particular configuration on a printed circuit board (PCB), ceramic, plastic, glass, or other suitable substrate, base, carrier, panel, or the like (described herein as a carrier 112). The plurality of antenna elements 122$i$, for example, may be arranged in concentric circles, in a circular arrangement, in columns and rows in a rectilinear arrangement, in a radial arrangement, in equal or uniform spacing between each other, in non-uniform spacing between each other, or in any other arrangement. Various example arrangements of the plurality of antenna elements 122$i$ in antenna lattices 120 defining antenna apertures (110A, 110B, 110C, and 110D) are shown, without limitation, on respective carriers 112A, 112B, 112C, and 112D in FIG. 1C.

The beamformer lattice 140 includes a plurality of beamformers 142$i$ including a plurality of phase shifters 145$i$. In the receiving direction RX, the beamformer function is to delay the signals arriving from each antenna element so the signals all arrive to the combining network at the same time. In the transmitting direction TX, the beamformer function is to delay the signal sent to each antenna element such that all signals arrive at the target location at the same time. This delay can be accomplished by using "true time delay" or a phase shift at a specific frequency.

Following the transmitting direction of arrow TX in the schematic illustration of FIG. 1A, in a transmitting phased array antenna system 100, the outgoing radio frequency (RF) signals are routed from the modulator 170 via the distributer 160 to a plurality of individual phase shifters 145$i$ in the beamformer lattice 140. The RF signals are phase-offset by the phase shifters 145$i$ by different phases, which vary by a predetermined amount from one phase shifter to another. Each frequency needs to be phased by a specific amount in order to maintain the beam performance. If the phase shift applied to different frequencies follows a linear behavior, the phase shift is referred to as "true time delay". Common phase shifters, however, apply a constant phase offset for all frequencies.

For example, the phases of the common RF signal can be shifted by 0° at the bottom phase shifter 145$i$ in FIG. 1A, by $\Delta\alpha$ at the next phase shifter 145$i$ in the column, by 2$\Delta\alpha$ at the next phase shifter, and so on. As a result, the RF signals that arrive at amplifiers 124$i$ (when transmitting, the amplifiers are power amplifiers "PAs") are respectively phase-offset from each other. The PAs 124$i$ amplify these phase-offset RF signals, and antenna elements 122$i$ emit the RF signals S as electromagnetic waves.

Because of the phase offsets, the RF signals from individual antenna elements 122$i$ are combined into outgoing wave fronts that are inclined at angle ϕ from the antenna aperture 110 formed by the lattice of antenna elements 122$i$. The angle ϕ is called an angle of arrival (AoA) or a beamforming angle. Therefore, the choice of the phase offset $\Delta\alpha$ determines the radiation pattern of the combined signals S defining the wave front. In FIG. 1B, an exemplary phased array antenna radiation pattern of signals S from an antenna aperture 110 in accordance with one embodiment of the present disclosure is provided.

Following the receiving direction of arrow RX in the schematic illustration of FIG. 1A, in a receiving phased array antenna system 100, the signals S defining the wave front are detected by individual antenna elements 122$i$, and amplified by amplifiers 124$i$ (when receiving signals the amplifiers are low noise amplifiers "LNAs"). For any non-zero AoA, signals S comprising the same wave front reach the different antenna elements 122$i$ at different times. Therefore, the received signal will generally include phase offsets from one antenna element of the receiving (RX) antenna element to another. Analogously to the emitting phased array antenna case, these phase offsets can be adjusted by phase shifters 145$i$ in the beamformer lattice 140. For example, each phase shifter 145$i$ (e.g., a phase shifter chip) can be programmed to adjust the phase of the signal to the same reference, such that the phase offset among the individual antenna elements 122$i$ is canceled in order to combine the RF signals corresponding to the same wave front. As a result of this constructive combining of signals, a higher signal to noise ratio (SNR) can be attained on the received signal, which results in increased channel capacity.

Still referring to FIG. 1A, a mapping system 130 may be disposed between the antenna lattice 120 and the beamformer lattice 140 to provide length matching for equidistant electrical connections between each antenna element 122$i$ of the antenna lattice 120 and the phase shifters 145$i$ in the beamformer lattice 140, as will be described in greater detail below. A multiplex feed or hierarchical network 150 may be disposed between the beamformer lattice 140 and the distributor/combiner 160 to distribute a common RF signal to the phase shifters 145$i$ of the beamformer lattice 140 for respective appropriate phase shifting and to be provided to the antenna elements 122$i$ for transmission, and to combine RF signals received by the antenna elements 122$i$, after appropriate phase adjustment by the beamformers 142$i$.

In accordance with some embodiments of the present disclosure, the antenna elements 122$i$ and other components of the phased array antenna system 100 may be contained in an antenna module to be carried by the carrier 112. (See, for example, antenna modules 226$a$ and 226$b$ in FIG. 2B). In the illustrated embodiment of FIG. 2B, there is one antenna element 122$i$ per antenna module 226$a$. However, in other embodiments of the present disclosure, antenna modules 226$a$ may incorporate more than one antenna element 122$i$.

Figure 1D:
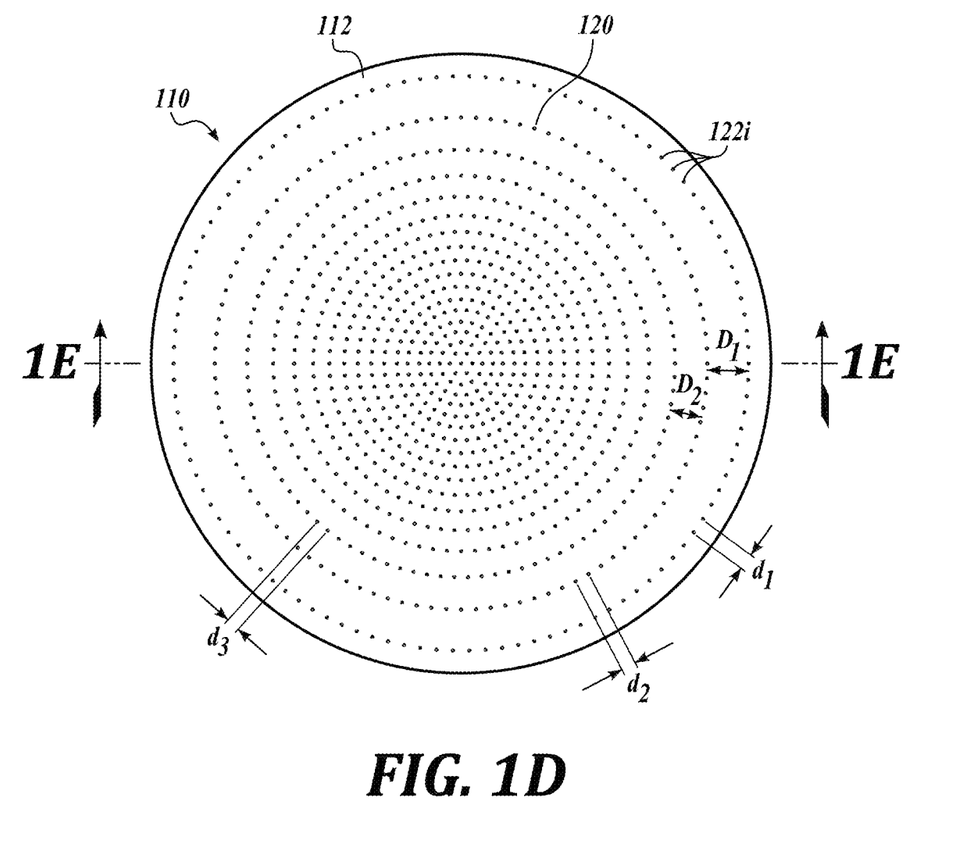
FIG. 1D illustrates individual antenna elements in a space tapered configuration to define an antenna aperture in accordance with embodiments of the present disclosure.
Figure 1E:
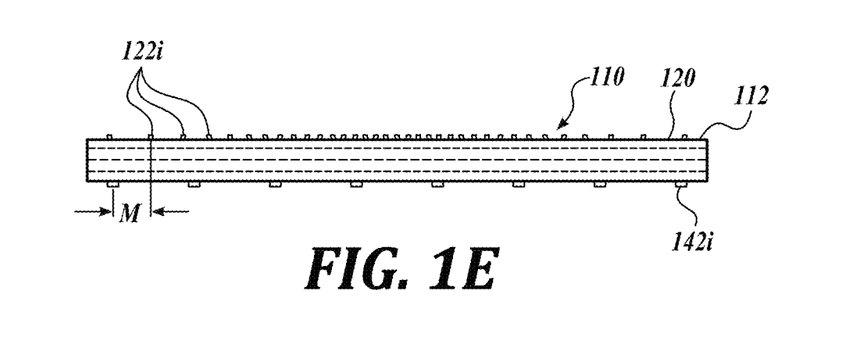
FIG. 1E is a cross-sectional view of a panel defining the antenna aperture in FIG. 1D.

Referring to FIGS. 1D and 1E, an exemplary configuration for an antenna aperture 120 in accordance with one embodiment of the present disclosure is provided. In the illustrated embodiment of FIGS. 1D and 1E, the plurality of antenna elements 122$i$ in the antenna lattice 120 are distributed with a space taper configuration on the carrier 112. In accordance with a space taper configuration, the number of antenna elements 122$i$ changes in their distribution from a center point of the carrier 112 to a peripheral point of the carrier 112. For example, compare spacing between adjacent antenna elements 122$i$, D1 to D2, and compare spacing between adjacent antenna elements 122$i$, d1, d2, and d3. Although shown as being distributed with a space taper configuration, other configurations for the antenna lattice are also within the scope of the present disclosure.

The system 100 includes a first portion carrying the antenna lattice 120 and a second portion carrying a beamformer lattice 140 including a plurality of beamformer elements. As seen in the cross-sectional view of FIG. 1E, multiple layers of the carrier 112 carry electrical and electromagnetic connections between elements of the phased array antenna system 100. In the illustrated embodiment, the antenna elements 122$i$ are located the top surface of the top layer and the beamformer elements 142$i$ are located on the bottom surface of the bottom layer. While the antenna elements 122$i$ may be configured in a first arrangement, such as a space taper arrangement, the beamformer elements 142$i$ may be arranged in a second arrangement different from the antenna element arrangement. For example, the number of antenna elements 122$i$ may be greater than the number of beamformer elements 142$i$, such that multiple antenna elements 122$i$ correspond to one beamformer element 142$i$. As another example, the beamformer elements 142$i$ may be laterally displaced from the antenna elements 122$i$ on the carrier 112, as indicated by distance M in FIG. 1E. In one embodiment of the present disclosure, the beamformer elements 142$i$ may be arranged in an evenly spaced or organized arrangement, for example, corresponding to an H-network, or a cluster network, or an unevenly spaced network such as a space tapered network different from the antenna lattice 120. In some embodiments, one or more additional layers may be disposed between the top and bottom layers of the carrier 112. Each of the layers may comprise one or more PCB layers.

Figure 1F:
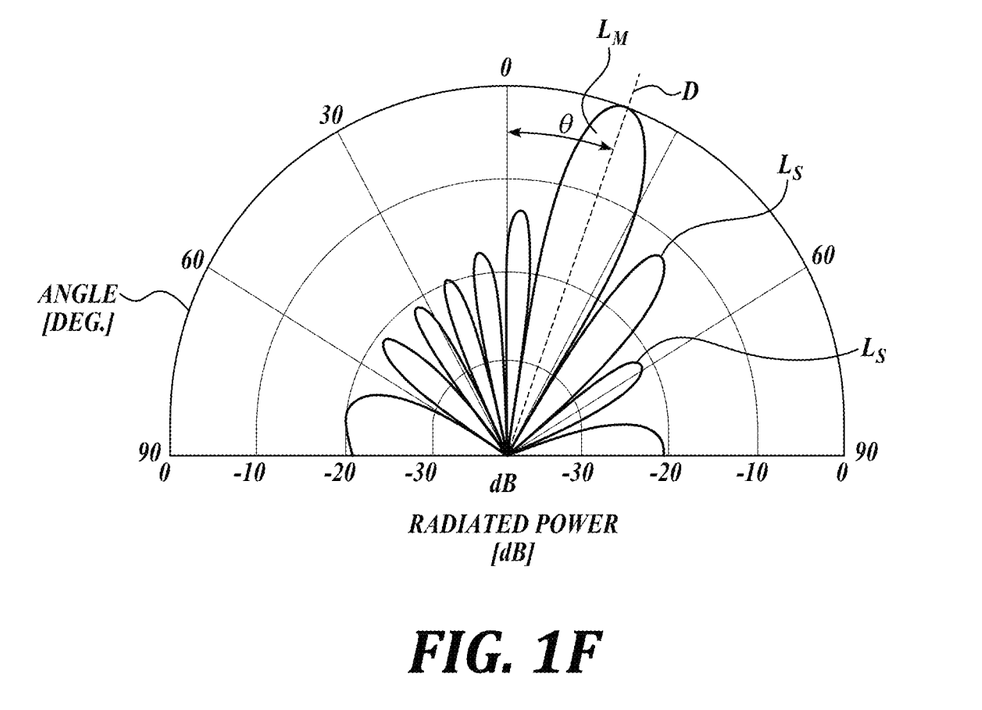
FIG. 1F is a graph of a main lobe and undesirable side lobes of an antenna signal.

Referring to FIG. 1F, a graph of a main lobe Lm and side lobes Ls of an antenna signal in accordance with embodiments of the present disclosure is provided. The horizontal (also the radial) axis shows radiated power in dB. The angular axis shows the angle of the RF field in degrees. The main lobe Lm represents the strongest RF field that is generated in a preferred direction by a phased array antenna system 100. In the illustrated case, a desired pointing angle D of the main lobe Lm corresponds to about 20°. Typically, the main lobe Lm is accompanied by a number of side lobes Ls. However, side lobes Ls are generally undesirable because they derive their power from the same power budget thereby reducing the available power for the main lobe Lm. Furthermore, in some instances the side lobes Ls may reduce the SNR of the antenna aperture 110. Also, side lobe reduction is important for regulation compliance.

One approach for reducing side lobes Ls is arranging elements 122$i$ in the antenna lattice 120 with the antenna elements 122$i$ being phase offset such that the phased array antenna system 100 emits a waveform in a preferred direction D with reduced side lobes. Another approach for reducing side lobes Ls is power tapering. However, power tapering is generally undesirable because by reducing the power of the side lobe Ls, the system has increased design complexity of requiring of "tunable and/or lower output" power amplifiers.

In addition, a tunable amplifier 124$i$ for output power has reduced efficiency compared to a non-tunable amplifier. Alternatively, designing different amplifiers having different gains increases the overall design complexity and cost of the system.

Yet another approach for reducing side lobes Ls in accordance with embodiments of the present disclosure is a space tapered configuration for the antenna elements 122$i$ of the antenna lattice 120. (See the antenna element 122$i$ configuration in FIGS. 1C and 1D.) Space tapering may be used to reduce the need for distributing power among antenna elements 122$i$ to reduce undesirable side lobes Ls. However, in some embodiments of the present disclosure, space taper distributed antenna elements 122$i$ may further include power or phase distribution for improved performance.

In addition to undesirable side lobe reduction, space tapering may also be used in accordance with embodiments of the present disclosure to reduce the number of antenna elements 122$i$ in a phased array antenna system 100 while still achieving an acceptable beam B from the phased array antenna system 100 depending on the application of the system 100. (For example, compare in FIG. 1C the number of space-tapered antenna elements 122$i$ on carrier 112D with the number of non-space tapered antenna elements 122$i$ carrier by carrier 112B.)

Figure 1G:
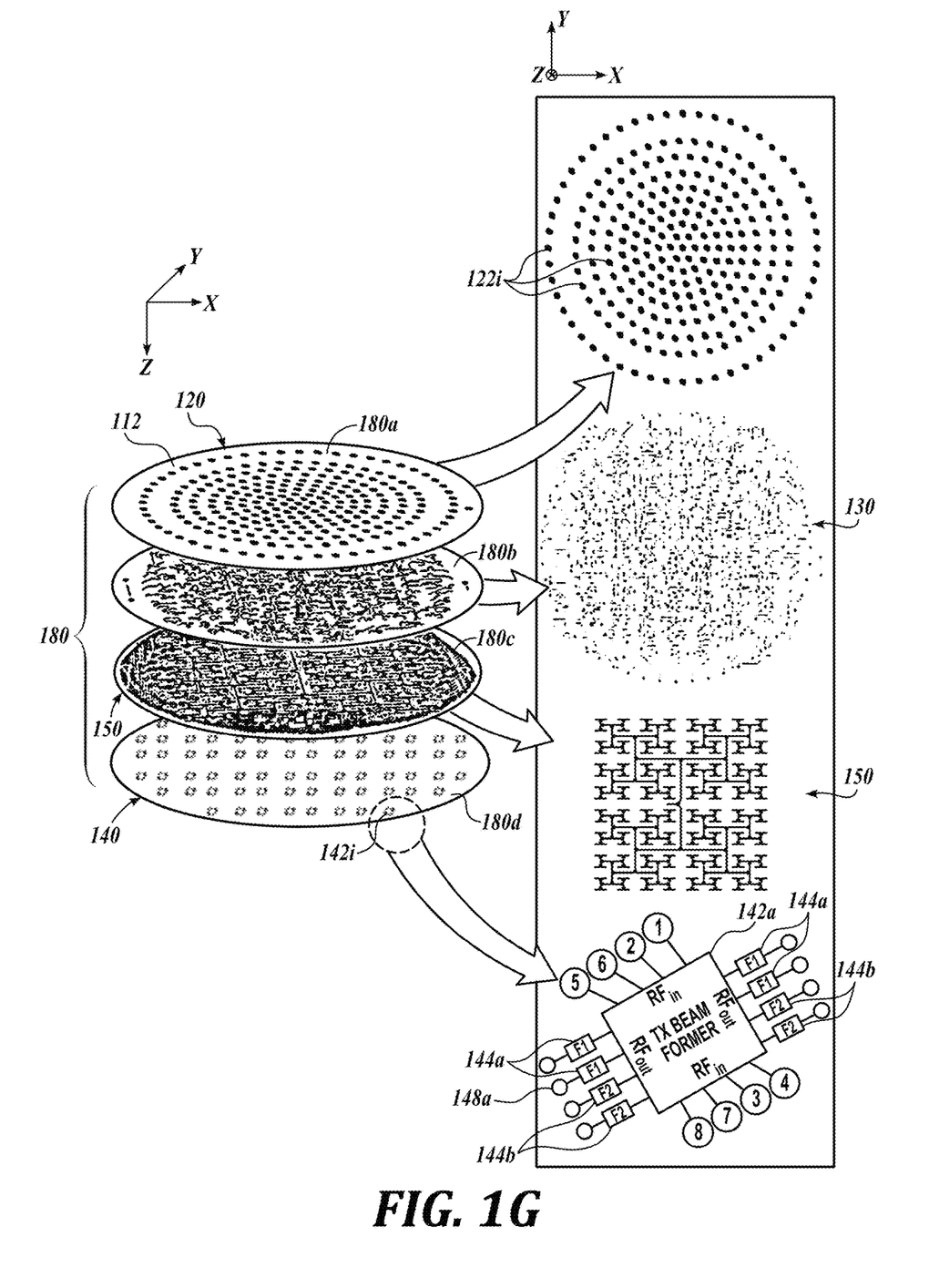
FIG. 1G illustrates an isometric view of a plurality of stack-up layers which make up a phased array antenna system in accordance with one embodiment of the present disclosure.

FIG. 1G depicts an exemplary configuration of the phased array antenna system 100 implemented as a plurality of PCB layers in lay-up 180 in accordance with embodiments of the present disclosure. The plurality of PCB layers in lay-up 180 may comprise a PCB layer stack including an antenna layer 180$a$, a mapping layer 180$b$, a multiplex feed network layer 180$c$, and a beamformer layer 180$d$. In the illustrated embodiment, mapping layer 180$b$ is disposed between the antenna layer 180$a$ and multiplex feed network layer 180$c$, and the multiplex feed network layer 180$c$ is disposed between the mapping layer 180$b$ and the beamformer layer 180$d$.

Although not shown, one or more additional layers may be disposed between layers 180$a$ and 180$b$, between layers 180$b$ and 180$c$, between layers 180$c$ and 180$d$, above layer 180$a$, and/or below layer 180$d$. Each of the layers 180$a$, 180$b$, 180$c$, and 180$d$ may comprise one or more PCB sub-layers. In other embodiments, the order of the layers 180$a$, 180$b$, 180$c$, and 180$d$ relative to each other may differ from the arrangement shown in FIG. 1G. For instance, in other embodiments, beamformer layer 180$d$ may be disposed between the mapping layer 180$b$ and multiplex feed network layer 180$c$.

Layers 180$a$, 180$b$, 180$c$, and 180$d$ may include electrically conductive traces (such as metal traces that are mutually separated by electrically isolating polymer or ceramic), electrical components, mechanical components, optical components, wireless components, electrical coupling structures, electrical grounding structures, and/or other structures configured to facilitate functionalities associated with the phase array antenna system 100. Structures located on a particular layer, such as layer 180$a$, may be electrically interconnected with vertical vias (e.g., vias extending along the z-direction of a Cartesian coordinate system) to establish electrical connection with particular structures located on another layer, such as layer 180$d$.

Antenna layer 180$a$ may include, without limitation, the plurality of antenna elements 122$i$ arranged in a particular arrangement (e.g., a space taper arrangement) as an antenna lattice 120 on the carrier 112. Antenna layer 180$a$ may also include one or more other components, such as corresponding amplifiers 124$i$. Alternatively, corresponding amplifiers 124$i$ may be configured on a separate layer. Mapping layer 180$b$ may include, without limitation, the mapping system 130 and associated carrier and electrical coupling structures. Multiplex feed network layer 180$c$ may include, without limitation, the multiplex feed network 150 and associated carrier and electrical coupling structures. Beamformer layer 180$d$ may include, without limitation, the plurality of phase shifters 145$i$, other components of the beamformer lattice 140, and associated carrier and electrical coupling structures. Beamformer layer 180$d$ may also include, in some embodiments, modulator/demodulator 170 and/or coupler structures. In the illustrated embodiment of FIG. 1G, the beamformers 142$i$ are shown in phantom lines because they extend from the underside of the beamformer layer 180$d$.

Although not shown, one or more of layers 180$a$, 180$b$, 180$c$, or 180$d$ may itself comprise more than one layer. For example, mapping layer 180$b$ may comprise two or more layers, which in combination may be configured to provide the routing functionality discussed above. As another example, multiplex feed network layer 180$c$ may comprise two or more layers, depending upon the total number of multiplex feed networks included in the multiplex feed network 150.

Figure 2A:
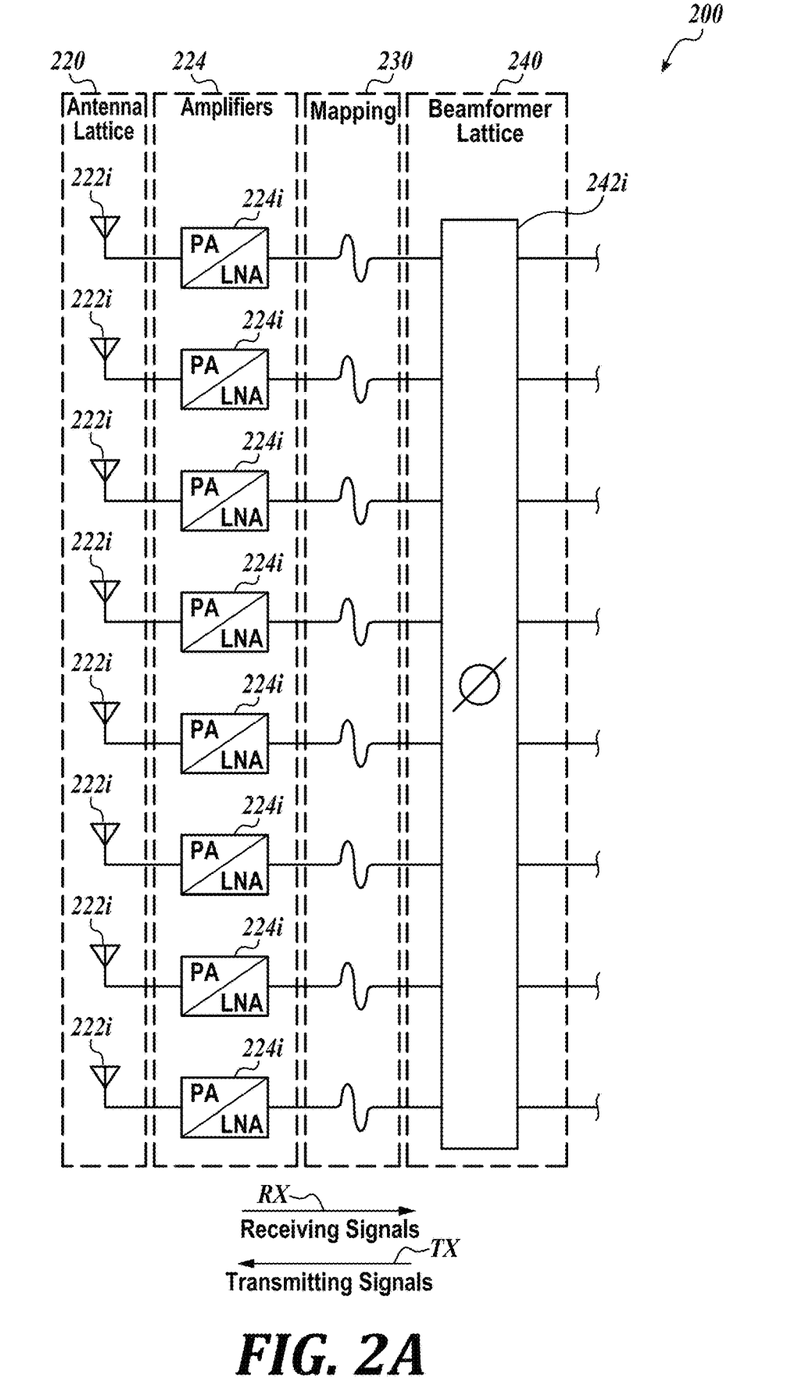
FIG. 2A illustrates a schematic of an electrical configuration for multiple antenna elements in an antenna lattice coupled to a single beamformer in a beamformer lattice in accordance with one embodiment of the present disclosure.

In accordance with embodiments of the present disclosure, the phased array antenna system 100 may be a multi-beam phased array antenna system. In a multi-beam phased array antenna configuration, each beamformer 142$i$ may be electrically coupled to more than one antenna element 122$i$. The total number of beamformer 142$i$ may be smaller than the total number of antenna elements 122$i$. For example, each beamformer 142$i$ may be electrically coupled to four antenna elements 122$i$ or to eight antenna elements 122$i$. FIG. 2A illustrates an exemplary multi-beam phased array antenna system in accordance with one embodiment of the present disclosure in which eight antenna elements 222$i$ are electrically coupled to one beamformer 242$i$. In other embodiments, each beamformer 142$i$ may be electrically coupled to more than eight antenna elements 122$i$.

Figure 2B:
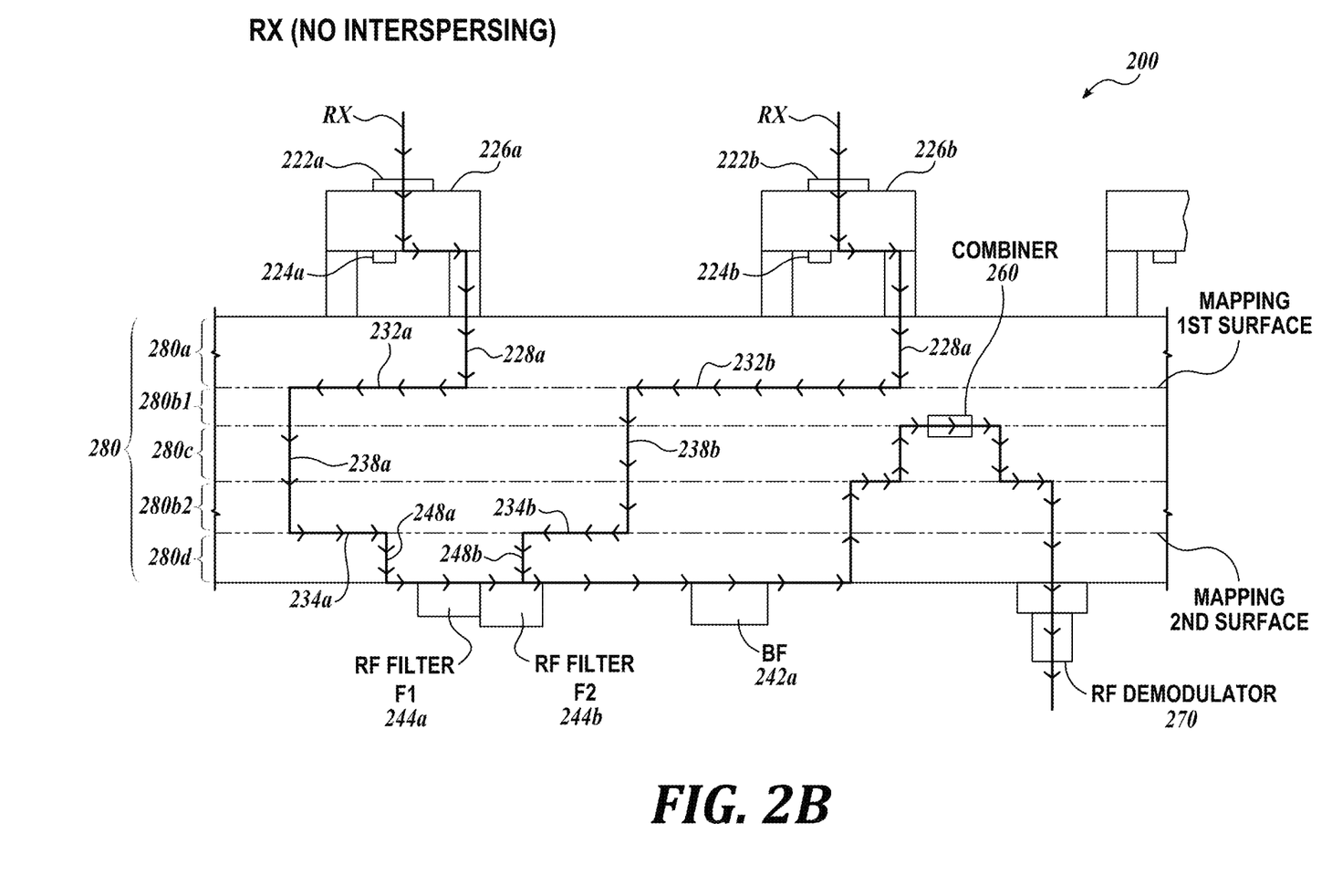
FIG. 2B illustrates a schematic cross section of a plurality of stack-up layers which make up a phased array antenna system in an exemplary receiving system in accordance with the electrical configuration of FIG. 2A.

FIG. 2B depicts a partial, close-up, cross-sectional view of an exemplary configuration of the phased array antenna system 200 of FIG. 2A implemented as a plurality of PCB layers 280 in accordance with embodiments of the present disclosure. Like part numbers are used in FIG. 2B as used in FIG. 1G with similar numerals, but in the 200 series.

In the illustrated embodiment of FIG. 2B, the phased array antenna system 200 is in a receiving configuration (as indicated by the arrows RX). Although illustrated as in a receiving configuration, the structure of the embodiment of FIG. 2B may be modified to be also be suitable for use in a transmitting configuration.

Signals are detected by the individual antenna elements 222$a$ and 222$b$, shown in the illustrated embodiment as being carried by antenna modules 226$a$ and 226$b$ on the top surface of the antenna lattice layer 280$a$. After being received by the antenna elements 222$a$ and 222$b$, the signals are amplified by the corresponding low noise amplifiers (LNAs) 224$a$ and 224$b$, which are also shown in the illustrated embodiment as being carried by antenna modules 226$a$ and 226$b$ on a top surface of the antenna lattice layer 280$a$.

In the illustrated embodiment of FIG. 2B, a plurality of antenna elements 222$a$ and 222$b$ in the antenna lattice 220 are coupled to a single beamformer 242$a$ in the beamformer lattice 240 (as described with reference to FIG. 2A). However, a phased array antenna system implemented as a plurality of PCB layers having a one-to-one ratio of antenna elements to beamformer elements or having a greater than one-to-one ratio are also within the scope of the present disclosure. In the illustrated embodiment of FIG. 2B, the beamformers 242i are coupled to the bottom surface of the beamformer layer 280d.

In the illustrated embodiment, the antenna elements 222i and the beamformer elements 242i are configured to be on opposite surfaces of the lay-up of PCB layers 280. In other embodiments, beamformer elements may be co-located with antenna elements on the same surface of the lay-up. In other embodiments, beamformers may be located within an antenna module or antenna package.

As previously described, electrical connections coupling the antenna elements 222a and 222b of the antenna lattice 220 on the antenna layer 280a to the beamformer elements 242a of the beamformer lattice 240 on the beamformer layer 280d are routed on surfaces of one or more mapping layers 280b1 and 280b2 using electrically conductive traces. Exemplary mapping trace configurations for a mapping layer are provided in layer 130 of FIG. 1G.

In the illustrated embodiment, the mapping is shown on top surfaces of two mapping layers 280b1 and 280b2. However, any number of mapping layers may be used in accordance with embodiments of the present disclosure, including a single mapping layer. Mapping traces on a single mapping layer cannot cross other mapping traces. Therefore, the use of more than one mapping layer can be advantageous in reducing the lengths of the electrically conductive mapping traces by allowing mapping traces in horizontal planes to cross an imaginary line extending through the lay-up 280 normal to the mapping layers and in selecting the placement of the intermediate vias between the mapping traces.

In addition to mapping traces on the surfaces of layers 280b1 and 280b2, mapping from the antenna lattice 220 to the beamformer lattice 240 further includes one or more electrically conductive vias extending vertically through one or more of the plurality of PCB layers 280.

In the illustrated embodiment of FIG. 2B, a first mapping trace 232a between first antenna element 222a and beamformer element 242a is formed on the first mapping layer 280b1 of the lay-up of PCB layers 280. A second mapping trace 234a between the first antenna element 222a and beamformer element 242a is formed on the second mapping layer 280b2 of the lay-up of PCB layers 280. An electrically conductive via 238a connects the first mapping trace 232a to the second mapping trace 234a. Likewise, an electrically conductive via 228a connects the antenna element 222a (shown as connecting the antenna module 226a including the antenna element 222a and the amplifier 224a) to the first mapping trace 232a. Further, an electrically conductive via 248a connects the second mapping trace 234a to RF filter 244a and then to the beamformer element 242a, which then connects to combiner 260 and RF demodulator 270.

Of note, via 248a corresponds to via 148a and filter 244a corresponds to filter 144a, both shown on the surface of the beamformer layer 180d in the previous embodiment of FIG. 1G. In some embodiments of the present disclosure, filters may be omitted depending on the design of the system.

Similar mapping connects the second antenna element 222b to RF filter 244b and then to the beamformer element 242a. The second antenna element 222b may operate at the same or at a different value of a parameter than the first antenna element 222a (for example at different frequencies). If the first and second antenna elements 222a and 222b operate at the same value of a parameter, the RF filters 244a and 244b may be the same. If the first and second antenna elements 222a and 222b operate at different values, the RF filters 244a and 244b may be different.

Mapping traces and vias may be formed in accordance with any suitable methods. In one embodiment of the present disclosure, the lay-up of PCB layers 280 is formed after the multiple individual layers 280a, 280b, 280c, and 280d have been formed. For example, during the manufacture of layer 280a, electrically conductive via 228a may be formed through layer 280a. Likewise, during the manufacture of layer 280d, electrically conductive via 248a may be formed through layer 280d. When the multiple individual layers 280a, 280b, 280c, and 280d are assembled and laminated together, the electrically conductive via 228a through layer 280a electrically couples with the trace 232a on the surface of layer 280b1, and the electrically conductive via 248a through layer 280d electrically couples with the trace 234a on the surface of layer 280b2.

Other electrically conductive vias, such as via 238a coupling trace 232a on the surface of layer 280b1 and trace 234a on the surface of layer 280b2 can be formed after the multiple individual layers 280a, 280b, 280c, and 280d are assembled and laminated together. In this construction method, a hole may be drilled through the entire lay-up 280 to form the via, metal is deposited in the entirety of the hole forming an electrically connection between the traces 232a and 234a. In some embodiments of the present disclosure, excess metal in the via not needed in forming the electrical connection between traces 232a and 234a can be removed by back-drilling the metal at the top and/or bottom portions of the via. In some embodiments, back-drilling of the metal is not performed completely, leaving a via "stub". Tuning may be performed for a lay-up design with a remaining via "stub". In other embodiments, a different manufacturing process may produce a via that does not span more than the needed vertical direction.

As compared to the use of one mapping layer, the use of two mapping layers 280b1 and 280b2 separated by intermediate vias 238a and 238b as seen in the illustrated embodiment of FIG. 2B allows for selective placement of the intermediate vias 238a and 238b. If these vias are drilled though all the layers of the lay-up 280, they can be selectively positioned to be spaced from other components on the top or bottom surfaces of the lay-up 280.

Figure 3A:
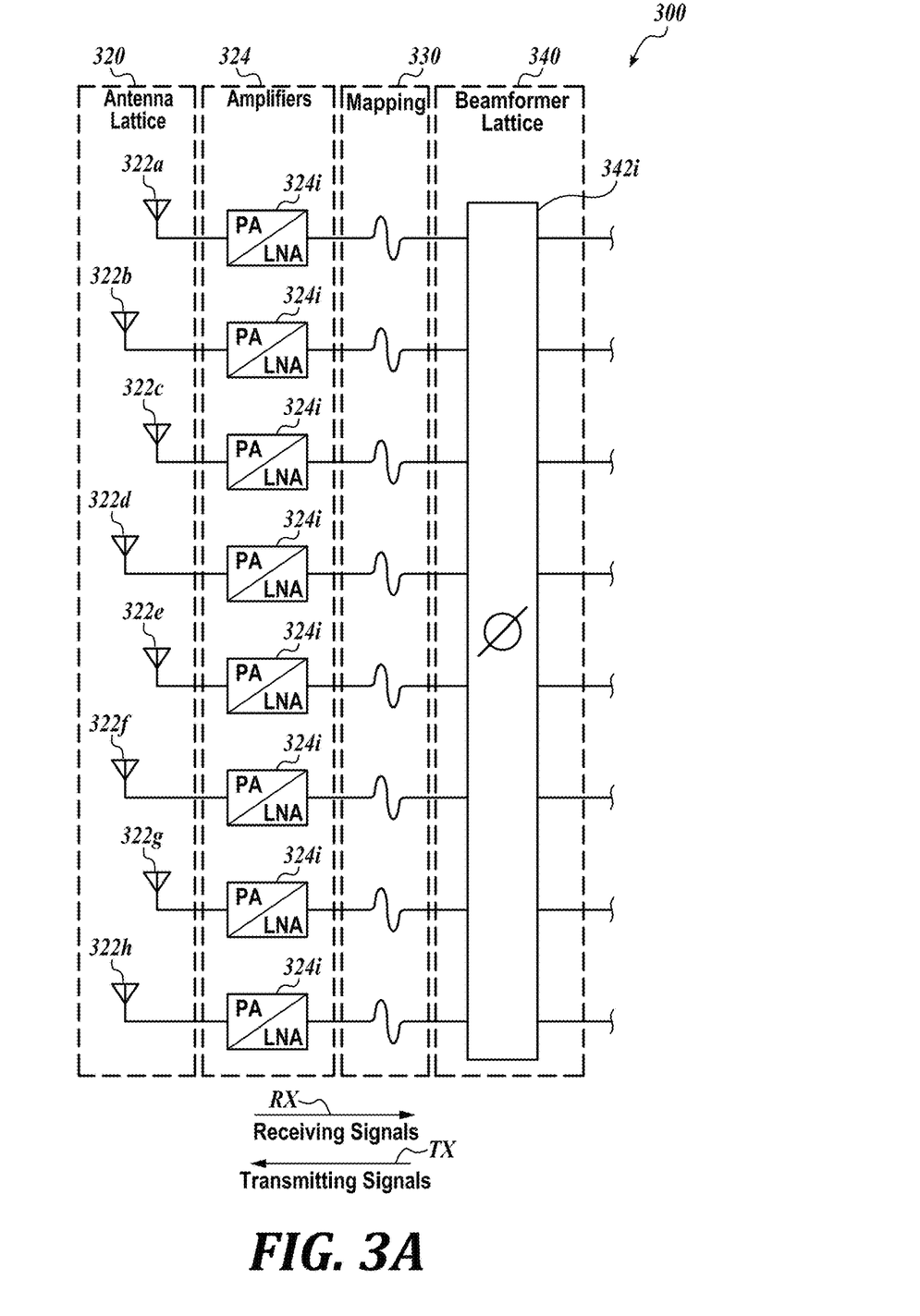
FIG. 3A illustrates a schematic of an electrical configuration for multiple interspersed antenna elements in an antenna lattice coupled to a single beamformer in a beamformer lattice in accordance with one embodiment of the present disclosure.
Figure 3B:
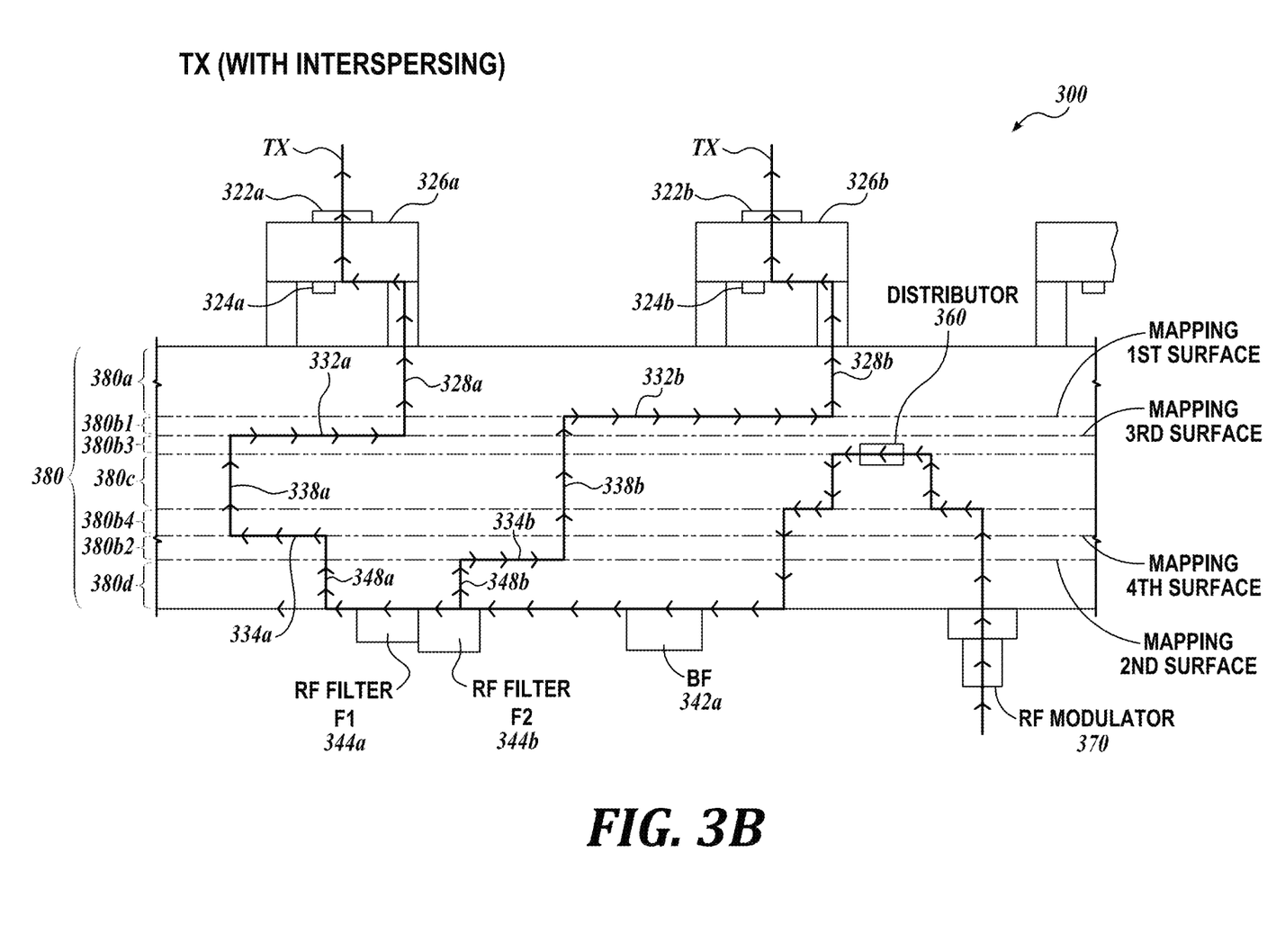
FIG. 3B illustrates a schematic cross section of a plurality of stack-up layers which make up a phased array antenna system in an exemplary transmitting and interspersed system in accordance with the electrical configuration of FIG. 3A.

FIGS. 3A and 3B are directed to another embodiment of the present disclosure. FIG. 3A illustrates an exemplary multi-beam phased array antenna system in accordance with one embodiment of the present disclosure in which eight antenna elements 322i are electrically coupled to one beamformer 342i, with the eight antenna elements 322i being into two different groups of interspersed antenna elements 322a and 322b.

FIG. 3B depicts a partial, close-up, cross-sectional view of an exemplary configuration of the phased array antenna system 300 implemented as a stack-up of a plurality of PCB layers 380 in accordance with embodiments of the present disclosure. The embodiment of FIG. 3B is similar to the embodiment of FIG. 2B, except for differences regarding interspersed antenna elements, the number of mapping layers, and the direction of signals, as will be described in greater detail below. Like part numbers are used in FIG. 3B as used in FIG. 3A with similar numerals, but in the 300 series.

In the illustrated embodiment of FIG. 3B, the phased array antenna system 300 is in a transmitting configuration (as indicated by the arrows TX). Although illustrated as in a transmitting configuration, the structure of the embodiment of FIG. 3B may be modified to also be suitable for use in a receiving configuration.

In some embodiments of the present disclosure, the individual antenna elements 322a and 322b may be configured to receive and/or transmit data at different values of one or more parameters (e.g., frequency, polarization, beam orientation, data streams, receive (RX)/transmit (TX) functions, time multiplexing segments, etc.). These different values may be associated with different groups of the antenna elements. For example, a first plurality of antenna elements carried by the carrier is configured to transmit and/or receive signals at a first value of a parameter. A second plurality of antenna elements carried by the carrier are configured to transmit and/or receive signals at a second value of the parameter different from the first value of the parameter, and the individual antenna elements of the first plurality of antenna elements are interspersed with individual antenna elements of the second plurality of antenna elements.

As a non-limiting example, a first group of antenna elements may receive data at frequency f1, while a second group of antenna elements may receive data at frequency f2.

The placement on the same carrier of the antenna elements operating at one value of the parameter (e.g., first frequency or wavelength) together with the antenna elements operating at another value of the parameter (e.g., second frequency or wavelength) is referred to herein as "interspersing". In some embodiments, the groups of antenna elements operating at different values of parameter or parameters may be placed over separate areas of the carrier in a phased array antenna. In some embodiments, at least some of the antenna elements of the groups of antenna elements operating at different values of at least one parameter are adjacent or neighboring one another. In other embodiments, most or all of the antenna elements of the groups of antenna elements operating at different values of at least one parameter are adjacent or neighboring one another.

In the illustrated embodiment of FIG. 3A, antenna elements 322a and 322b are interspersed antenna elements with first antenna element 322a communicating at a first value of a parameter and second antenna element 322a communicating at a second value of a parameter.

Although shown in FIG. 3A as two groups of interspersed antenna elements 322a and 322b in communication with a single beamformer 342a, the phased array antenna system 300 may be also configured such that one group of interspersed antenna elements communicate with one beamformer and another group of interspersed antenna elements communicate with another beamformer.

In the illustrated embodiment of FIG. 3B, the lay-up 380 includes four mapping layers 380b1, 380b2, 380b3, and 380b4, compared to the use of two mapping layers 280b1 and 280b2 in FIG. 2B. Mapping layers 380b1 and 380b2 are connected by intermediate via 338a. Mapping layers 380b3 and 380b4 are connected by intermediate via 338b. Like the embodiment of FIG. 2B, the lay-up 380 of the embodiment of FIG. 3B can allow for selective placement of the intermediate vias 338a and 338b, for example, to be spaced from other components on the top or bottom surfaces of the lay-up 380.

The mapping layers and vias can be arranged in many other configurations and on other sub-layers of the lay-up 180 than the configurations shown in FIGS. 2B and 3B. The use of two or more mapping layers can be advantageous in reducing the lengths of the electrically conductive mapping traces by allowing mapping traces in horizontal planes to cross an imaginary line extending through the lay-up normal to the mapping layers and in selecting the placement of the intermediate vias between the mapping traces. Likewise, the mapping layers can be configured to correlate to a group of antenna elements in an interspersed configuration. By maintaining consistent via lengths for each grouping by using the same mapping layers for each grouping, trace length is the only variable in length matching for each antenna to beamformer mapping for each grouping.

While illustrative embodiments have been illustrated and described, it will be appreciated that various changes can be made therein without departing from the spirit and scope of the disclosure.

The embodiments of the disclosure in which an exclusive property or privilege is claimed are defined as follows:

1. A phased array antenna system, comprising:
   a first portion carrying an antenna lattice including:
      a plurality of antenna elements; and
      a plurality of amplifiers, wherein the plurality of antenna elements are arranged in a first configuration and are coupled to the plurality of amplifiers; and
   a second portion carrying a beamformer lattice including:
      a plurality of beamformer elements, wherein the plurality of beamformer elements are arranged in a second configuration different from the first configuration, wherein each of the plurality of amplifiers are electrically coupled to one of the plurality of beamformer elements, wherein the first and second portions define at least a portion of a carrier having a first side facing in a first direction and a second side facing in a second direction away from the first direction, and wherein the antenna lattice is on the first side of the carrier and the beamformer lattice is on the second side of the carrier.

2. The phased array antenna system of claim 1, wherein at least one of the plurality of antenna elements is laterally spaced from a corresponding one of the plurality of beamformer elements.

3. The phased array antenna system of claim 1, wherein the first configuration is a space tapered configuration.

4. The phased array antenna system of claim 1, wherein the second configuration is an organized configuration.

5. The phased array antenna system of claim 1, wherein the antenna elements and the beamformer elements are in a 1:1 ratio.

6. The phased array antenna system of claim 1, wherein the antenna elements and the beamformer elements are in a greater than 1:1 ratio.

7. The phased array antenna system of claim 1, wherein the first and second portions are first and second layers.

8. The phased array antenna system of claim 7, wherein the first and second layers are discrete PCB layers in a PCB stack.

9. The phased array antenna system of claim 8, wherein at least one of the first and second layers includes a plurality of sub-layers.

10. The phased array antenna system of claim 7, further comprising a first plurality of vias, each via of the first plurality of vias extending between at least one of the first and second layers and connecting one of the plurality of antenna elements or one of the plurality of beamformer elements to one of the plurality of amplifiers.

11. The phased array antenna system of claim 10, further comprising:
   a third layer, which includes a plurality of sub-layers disposed between the first layer and the second layer, wherein a first sub-layer of the plurality of sub-layers carries a first portion of a first plurality of mapping traces and a second sub-layer of the plurality of sub-layers carries a second portion of the first plurality of mapping traces, wherein at least some of the first and second plurality of mapping traces provide at least a portion of an electrical connection between the plurality of antenna elements and the plurality of beamformer elements.

12. The phased array antenna system of claim 11, further comprising a second plurality of vias extending between the first and second sub-layers, each via of the second plurality of vias connecting one of the first portion of the first plurality of mapping traces to one of the second portion of the first plurality of mapping traces.

13. The phased array antenna system of claim 11, further wherein the first plurality of vias includes at least one via connecting one of the plurality of beamformer elements to one of the second portion of the first plurality of mapping traces.

14. The phased array antenna system of claim 11, wherein the first portion of the first plurality of mapping traces do not cross each other and the second portion of the first plurality of mapping traces do not cross each other.

15. The phased array antenna system of claim 11, wherein the first portion of the first plurality of mapping traces in the first sub-layer and the second portion of the first plurality of mapping traces in the second sub-layer cross a line extending normal to the first and second sub-layers.

16. The phased array antenna system of claim 11, wherein the second portion of the first plurality of mapping traces are equidistant in length for RF signal propagation.

17. The phased array antenna system of claim 1, wherein the antenna lattice includes a first plurality of antenna elements configured for operating at a first value of a parameter and a second plurality of antenna elements configured for operating at a second value of a parameter.

18. The phased array antenna system of claim 11, wherein a third layer includes at least first and second sub-layers disposed between the first layer and the second layer, wherein a first plurality of mapping traces in at least the first sub-layer is electrically coupled to a first plurality of antenna elements, and wherein a second plurality of mapping traces in at least the second sub-layer is electrically coupled to a second plurality of antenna elements.

19. The phased array antenna system of claim 18, further comprising a first plurality of vias, each via of the first plurality of vias extending between at least one of the first and second layers and connecting one of the plurality of antenna elements or one of the plurality of beamformer elements to one of the first plurality of mapping traces.

20. The phased array antenna system of claim 18, wherein the first plurality of mapping traces in at least the first sub-layer are electrically coupled to the first plurality of antenna elements, and wherein the second plurality of mapping traces in at least the second sub-layer are electrically coupled to the second plurality of antenna elements.

21. The phased array antenna system of claim 20, further comprising a second plurality of vias through the third layer, each via of the second plurality of vias electrically coupling at least some of the first plurality of mapping traces with at least some of a third plurality of mapping traces on a third sub-layer of the third layer or at least some of the second plurality of mapping traces with at least some of a fourth plurality of mapping traces on a fourth-sub-layer of the third layer.

22. The phased array antenna system of claim 1, wherein the first portion further comprises a plurality of conducting traces electrically coupled to the plurality of antenna elements.

23. The phased array antenna system of claim 22, wherein the plurality of conducting traces are electrically coupled to the plurality of amplifiers.

* * * * *